United States Patent [19]

Beck, Jr.

[11] Patent Number: 5,073,116
[45] Date of Patent: Dec. 17, 1991

[54] SURFACE MOUNT LCC SOCKET

[75] Inventor: Hoy S. Beck, Jr., Lexington, N.C.

[73] Assignee: AMP Incorporated, Harrisburg, Pa.

[21] Appl. No.: 664,154

[22] Filed: Mar. 1, 1991

[51] Int. Cl.⁵ .................... H01R 9/09; H01R 13/62
[52] U.S. Cl. ...................................... 439/71; 439/331
[58] Field of Search .................... 439/68, 70-73, 439/330, 331, 525, 526

[56] References Cited

U.S. PATENT DOCUMENTS 4,220,383  9/1980  Scheingold et al. .................. 439/71
4,502,747  3/1985  Bright et al. ......................... 439/331

Primary Examiner—Paula A. Bradley
Attorney, Agent, or Firm—Allan B. Osborne

[57] ABSTRACT

A socket (10) for use with leadless chip carriers has been disclosed. The socket (10) includes contact elements (16) positioned in cavities (34) in a housing (12) and having a first spring arm (100) extending into a central opening (30) for engaging pads on the chip carrier and a second spring arm (102) extending outwardly of the housing (12) for electrical engagement with circuits on a substrate on which the socket (10) is mounted.

6 Claims, 5 Drawing Sheets

SURFACE MOUNT LCC SOCKET

FIELD OF THE INVENTION

The present invention discloses a socket for a leadless chip carrier. The socket includes contact elements having a first spring arm extending into a chip carrier opening for electrically engaging the chip carrier and a second spring arm extending outwardly from the housing for electrically engaging circuits on a substrate.

BACKGROUND OF THE INVENTION

U.S. Pat. No. 4,427,249 discloses a connector or socket for use with leadless chip carriers and having a cover for retaining and biasing the chip carrier against a cantilever beam on U-shaped contact elements positioned in the housing. The contact elements include a second beam spaced from the first and parallel thereto. Both beams extend outwardly from the bight and straddle a bar in the cavity. The contact elements are retained in the cavities by heat staking. It is now proposed to provide a socket with contact elements having a well defined retaining device which frictionally straddles a bar in the cavities. Further, one of the beams on the elements are designed for being soldered to the substrate on which the socket is mounted.

SUMMARY OF THE INVENTION

According to the present invention, a socket for use with leadless chip carriers is provided wherein the contact elements include a base section from which spring arms extend. One spring arm extends into a central opening for engaging a pad on the chip carrier and another spring arm extends outwardly from the socket for engaging a circuit on a substrate. Further, a retaining member projects away from the base section in parallel with one of the spring arms and in cooperation with the spring arm frictionally brackets a retaining bar in the cavity to retain the element therein.

DESCRIPTION OF THE INVENTION

Figure 1:
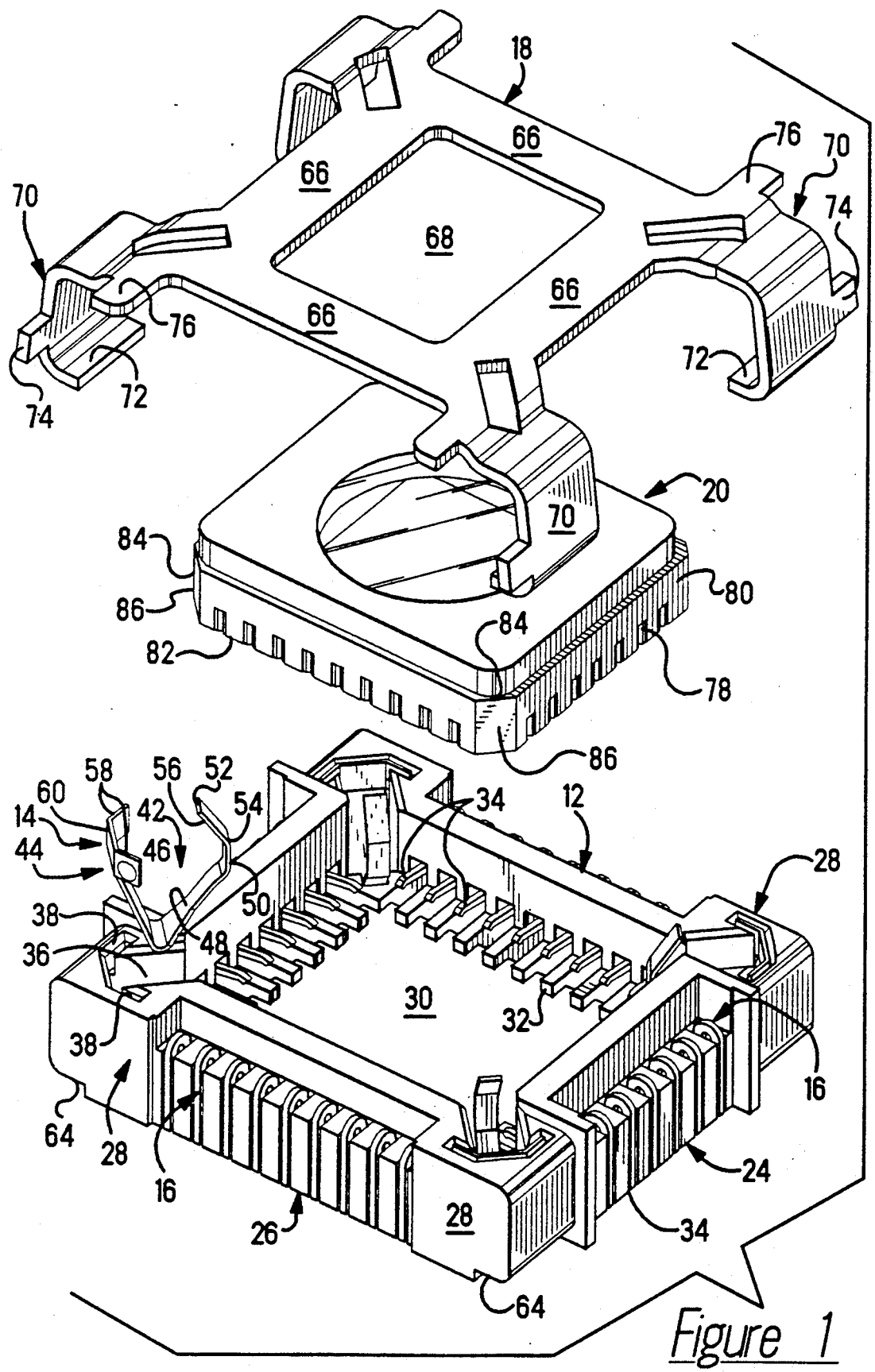
FIG. 1 is an exploded, perspective view of a socket according to the present invention and of a leadless chip carrier for which the socket was developed.

With reference to FIG. 1, socket 10 of the present invention includes housing 12, thrust clips 14, contact elements 16 and cover 18. Socket 10 has been developed to receive and electrically engage leadless chip carrier 20. As designed, socket 10 receives a thirty-two position carrier 20 but can be made for use with carriers having fewer or greater positions (not shown).

Housing 12 is preferably molded from a dielectric material such as liquid crystal polymer or polyphenylene sulfide and includes side walls 24,26 and corner blocks 28 all which cooperate to define central opening 30. Short ribs 32 extend into opening 30 from the lower edges of walls 24,26. Housing 12 is rectangular with walls 24 being shorter in length relative to walls 26. As a result walls 24 are provided with seven cavities 34 and walls 26 are provided with nine cavities 34.

Besides joining adjacent side walls 24,26, corner blocks 28 are provided with pockets 36 to receive thrust clips 14. Each pocket 36 is on a diagonal relative to opening 30 and is open thereto. Side slots 38 are located on each side of each pocket 36 and communicates therewith.

Thrust clips 14 are formed from a spring metal such as stainless steel and are V-shaped with legs 42,44 being joined by bight 46. First leg 42 includes first, second and third portions 48,50,52 respectively. When positioned in a pocket 36, second or middle portion 50 provides a flat surface 54 facing into opening 30. The third or top portion 52 is bent towards the second leg 44 to provide a finger tab 56.

Second leg 44 is provided with ears 58 on each side of and at free end 60. Ears 58 are bent in so as to be at an angle to leg 44.

As shown in FIG. 1, clips 14 are placed in pockets 36 and retained therein by ears 58 being received in slots 38. First leg 42 projects into central opening 30 with flat surface 54 on the middle portion 50 being parallel to the direction of insertion and withdrawal of carrier 20.

Corner blocks 28 are also provided with shoulders 64 which are on surfaces opposite those surfaces on which pockets 36 open.

Additional detail pertaining to housing 12 and more particularly cavities 34 are set forth below.

Cover 18 includes four sides 66 defining a central opening 68. Arms 70 extending outwardly and downwardly at each of the four corners are provided with inwardly projecting lips 72 at each free end. Further, each arm is provided with laterally projecting and spaced apart tabs 74-76. Cover 18 is made from a spring metal such as steel and is more fully disclosed in U.S. Pat. No. Re. 32,370.

Leadless chip carrier 20 connects the encapsulated integrated electronic chip to the outside world through recessed pads 78 located along the side walls 80 and bottom surface 82. Corners 84 joining side walls 80 are beveled to provide flat surfaces 86 facing diagonally outwardly relative to the carrier body 88. Carriers 20 such as shown in FIG. 1 are made by several manufacturers such as Advanced Micro Devices and ATMEL.

Figure 2:
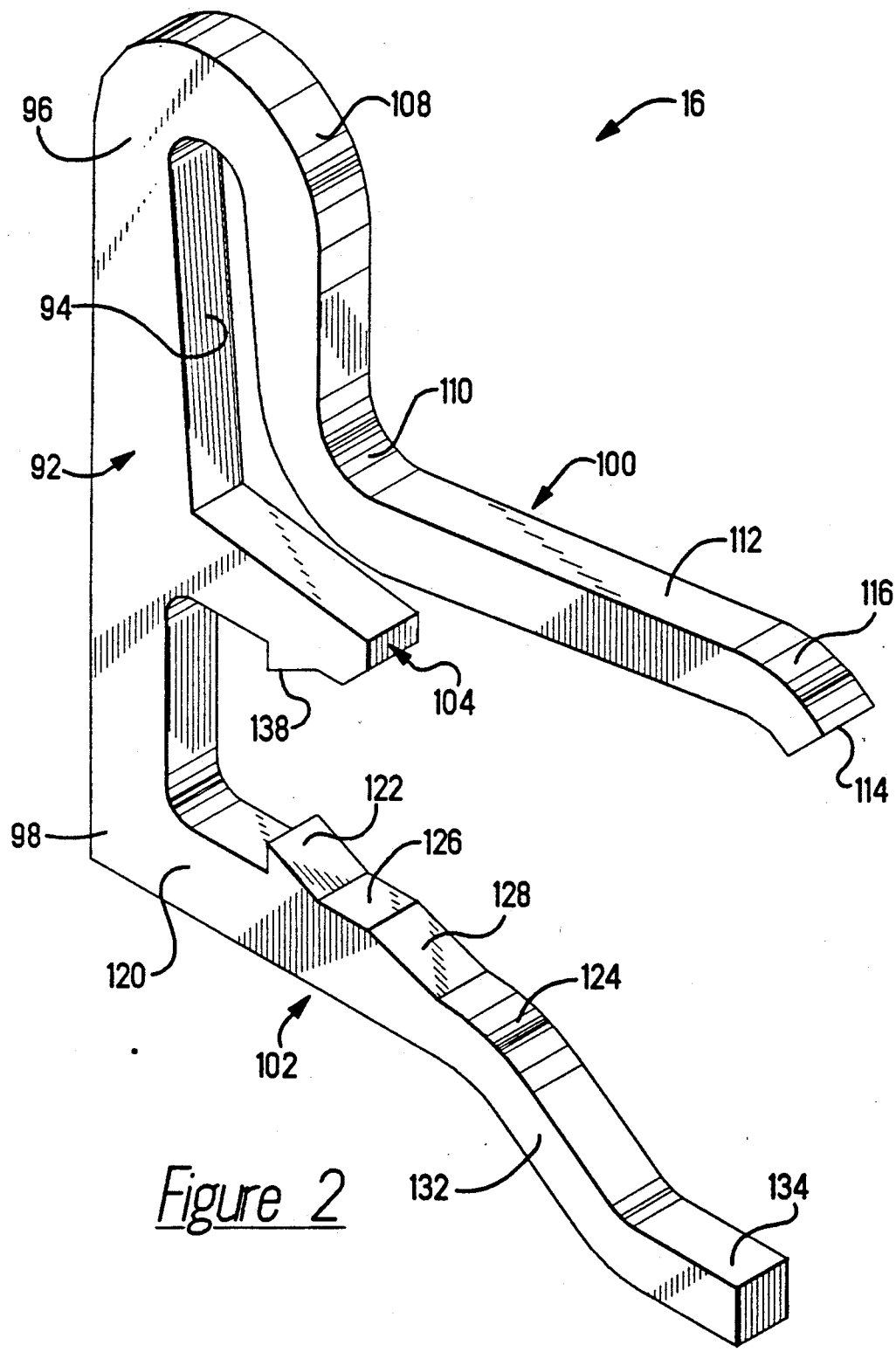
FIG. 2 is a perspective view of a contact element according to the present invention for use in the socket.

A contact element 16 is shown in FIG. 2 to which reference is now made. Element 16 is stamped from a suitable material such as phosphor bronze which has the desired spring and conductive properties.

Element 16 includes base section 92 which is relatively stiff due to its mass. Extending outwardly from edge 94 and from opposite free ends 96,98 are spring arms 100,102 respectively. Projecting outwardly from edge 94 and intermediate arms 100,102 is retaining member 104.

Spring arm 100 includes a first arcuate portion 108 which is attached at one end to free end 96 and curves down therefrom towards member 104. Arm 100 further includes a second arcuate portion 110 attached to and curves outwardly from first arcuate portion 110 and into a parallel relation with member 104. The two arcuate portions 108,110 describe generally an S-shape.

Attached to second arcuate portion 110 is beam 112 which extends normally outwardly relative to the axis of base section 92 and is slightly curved downwardly at its distal end 114 to provide a convex surface 116.

Overall, spring arm 100 is quite flexible.

Spring arm 102 includes a rather stiff first straight portion 120 which is attached to free end 98 and extends normally outwardly relative to the axis of base section 92. Barb 122 on first portion 120 projects towards member 104 from edge 124 of arm 102. Adjacent to barb 122 and on edge 124 are two flat areas 126,128 with the latter being at an angle to the former.

A curved portion 132 is attached to the first portion 120 and at the distal end of arm 102 is a second straight portion 134. As shown, second straight portion 134 is displaced out of the plane of first straight portion 120 by curved portion 132 which is intermediate the two straight portions 120,134.

As noted above, the first straight portion 120 is relatively stiff due to being thicker. Curved portion 132 and the second straight portion 134 are more flexible.

Retaining member 104 is quite stiff and carries barb 138 which points towards and is in alignment with barb 122 on spring arm 102.

Figure 3:
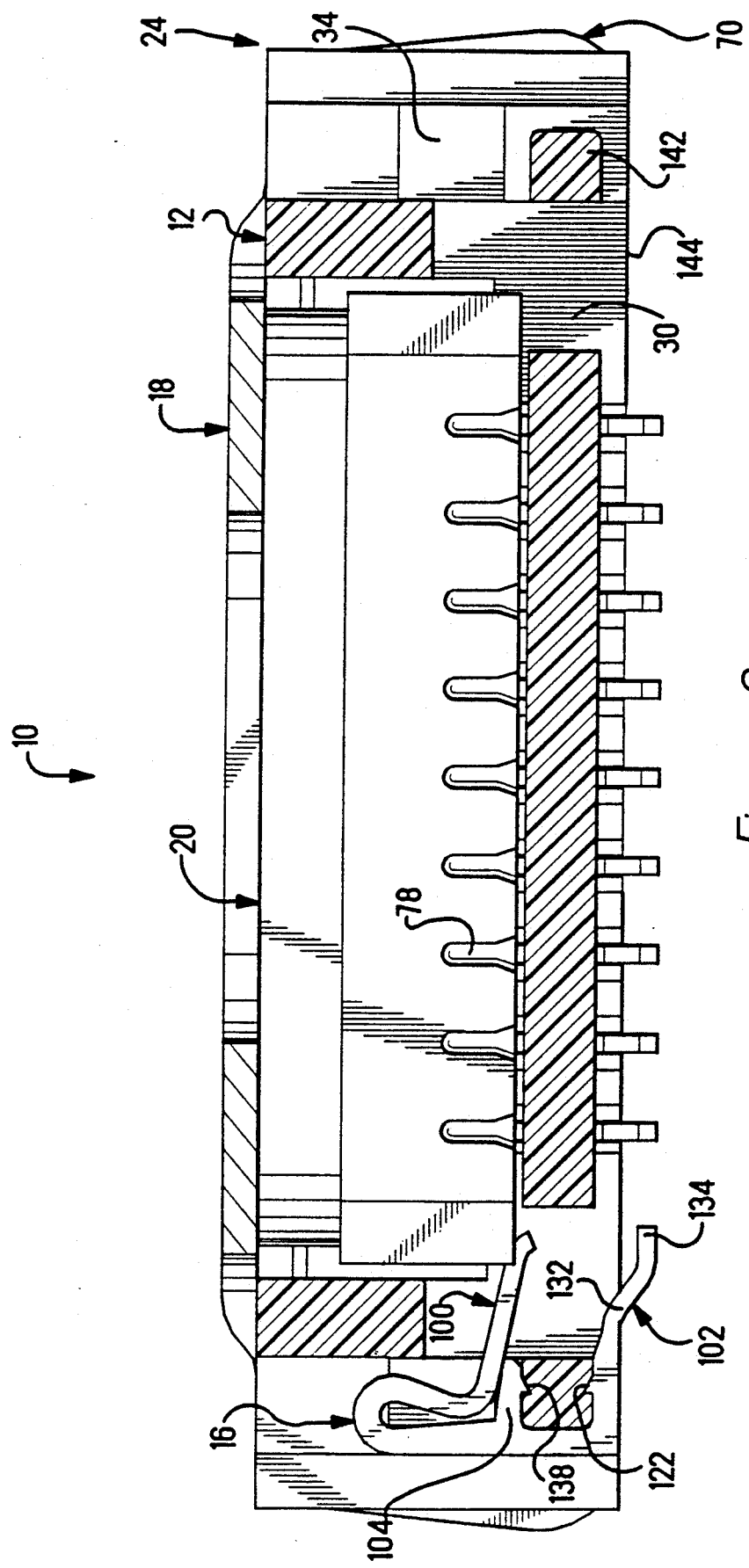
FIG. 3 is a side view, partly sectioned, showing the contact elements in the socket housing engaging the chip carrier.

FIG. 3 shows an empty cavity 34 on the right and one containing element 16 on the left. Cavities 34 are open in all directions and in that regard are more slotlike than a cavity. Retaining bar 142 crosses the width of each cavity 34 near the bottom surface 144 of housing 12.

Contact elements 16 are loaded into cavities 34 by being pushed thereinto from the side and are positioned with retaining member 104 and the first straight portion 120 on spring arm 102 bracketing retaining bar 142. As shown on the left, barbs 122 and 138 dig into bar 142 to retain element 16 in cavity 34.

Spring arm 100 extends into opening 30 and the curved portion 132 and second straight portion 134 on spring arm 102 extends outwardly below bottom surface 144 of housing 12 for electrical engagement with a pad on a substrate (not shown).

FIG. 3 also shows chip carrier 20 placed in central opening 30 with spring arm 100 engaging a recessed pad 78.

When cover 18 is positioned over and latched to housing 12, carrier 20 is forced against spring arms 100 to generate an engaging force with pads 78. Ribs 32 provide a stop or anti-overstress against which carrier 20 abuts when pushed down by cover 18.

Figure 4:
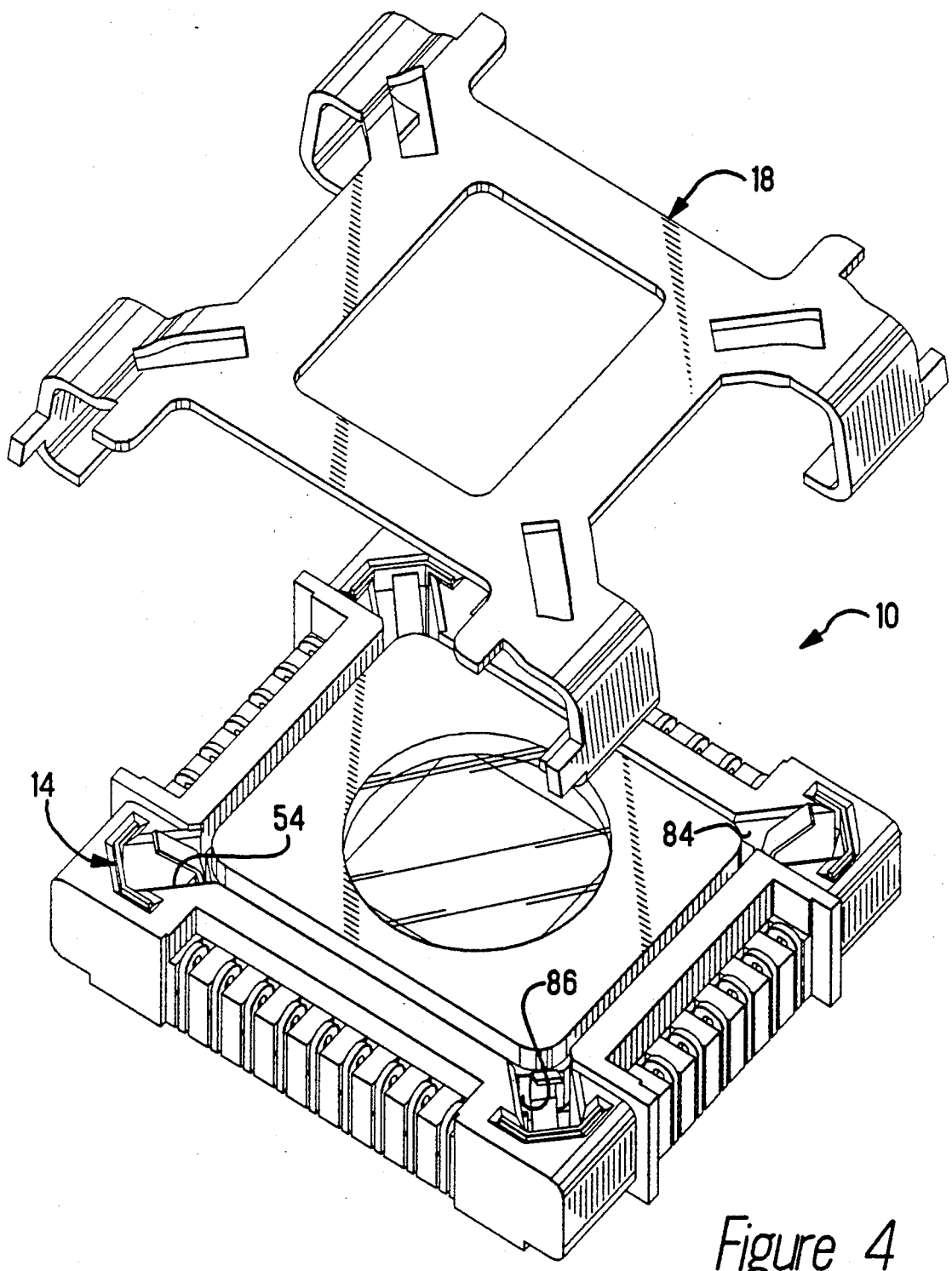
FIG. 4 is an exploded, perspective view of the socket with the chip carrier positioned therein.

FIG. 4 shows the engagement between thrust clips 14 and carrier 20. Flat surfaces 54 on legs 42 bear against flat surfaces 86 on corners 84. Carrier 20 is thereby centered within central opening 30 so that pads 78 will be in alignment with spring arms 100.

Figure 5:
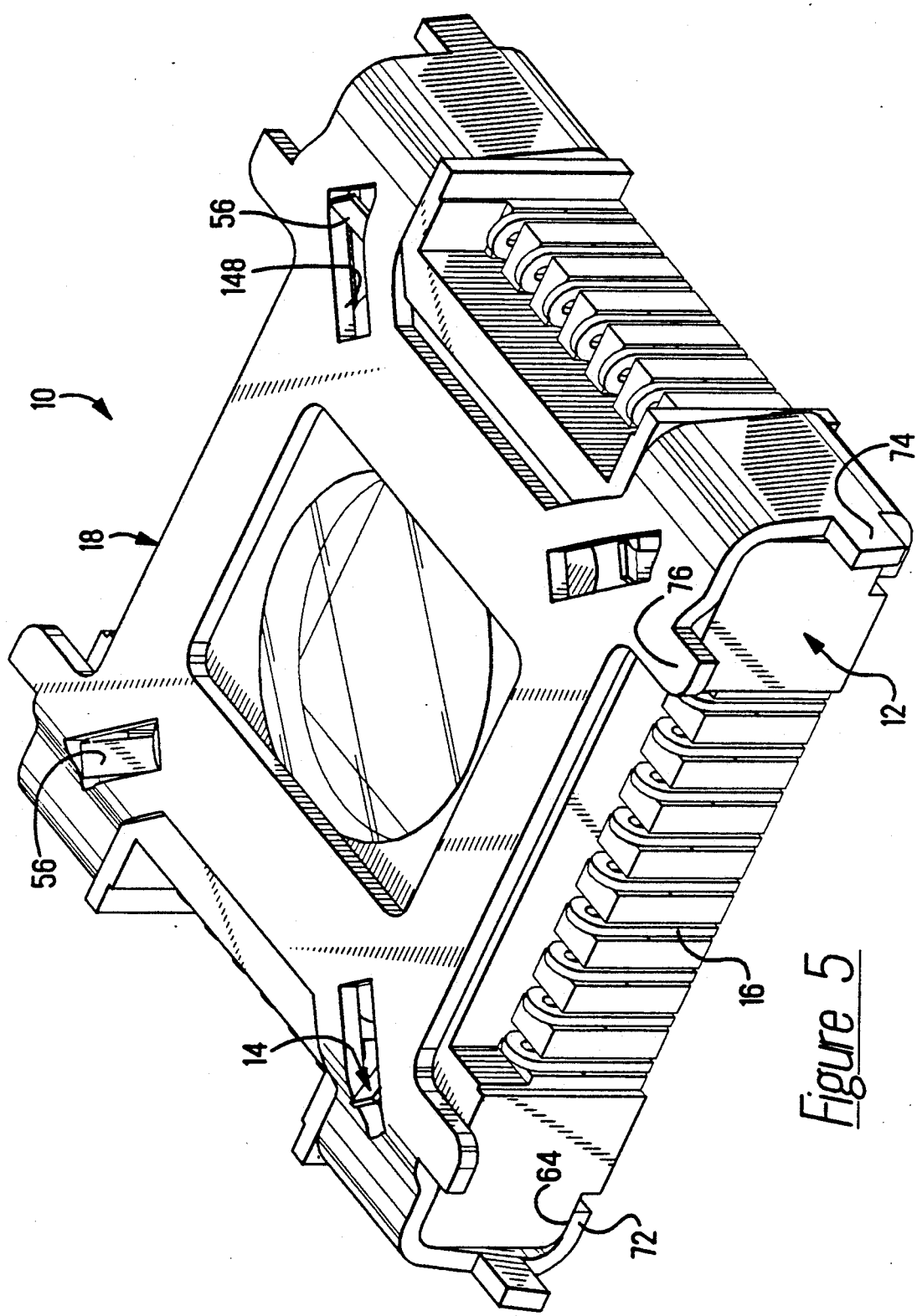
FIG. 5 is a perspective view of the socket with the chip carrier therein and with the cover installed.

FIG. 5 shows cover 18 latched to housing 12 by lips 72 being caught under shoulders 64. A screwdriver (not shown) or like tool positioned so that the tip is under tab 74 and the shank is pressing down against tab 76 will cause lip 72 to back out from beneath shoulder 64 to release cover 18. Openings 148 in each arm 70 provide access to tabs 56 on thrust clips 14.

Although not shown, the second straight portion 134 on arm 102, known as a "solder foot" may be replaced with other means, such as a pin, to electrically engage circuits on a substrate (not shown).

I claim:

1. A socket (10) for electrically interconnecting a leadless chip carrier to a substrate, said socket comprising:
   a dielectric housing (12) having side walls (24,26) and corner blocks (28) which define a central opening (30) for receiving a leadless chip carrier, said side walls (24,26) having cavities (34) opening into said central opening (30), and further having a retaining bar (142) in each of said cavities (34);
   a plurality of contact elements (16) formed from conductive material and having a rigid base section (92) with first and second spring arms (100,102) extending outwardly from respective ends (96,98) of said base section (92) and a retaining member (104) having a barb (138) extending outwardly from said base section (92) intermediate and parallel to said spring arms (100,102), said second spring arm (102) having a first straight portion (120) with a barb (122) thereon said elements (16) being disposed in respective cavities (34) in said housing (12) with said base sections (92) being parallel to the height of said housing (12) and said first springs arm (100) extending into said central opening (30) for electrical engagement with a leadless chip carrier which may be disposed therein and said second spring arm (102) extending outwardly from said housing (12) for electrical engagement with circuits on a substrate on which said socket may be mounted and said barbs (122,138) on said second spring arm (102) and said retaining member (104) respectively engaging opposite sides of said retaining bar (142); and
   a cover (18) for holding a leadless chip carrier in said central opening and for biasing said carrier against said first springs arms (100).

2. The socket (10) of claim 1 further having centering means (14) for centering a leadless chip carrier in said central opening (30).

3. The socket (10) of claim 2 wherein said corner blocks (28) are provided with pockets (36) opening into said central opening (30) and said centering means include thrust clips (14) positioned in respective said pockets (36) and having spring legs (42) protruding into said central opening (30).

4. The socket (10) of claim 1 wherein said first spring arm (100) includes a generally S-shaped section comprising a pair of reversed curved arcuate portions (108,110) and further includes a cantilever beam (112) attached to one of said arcuate portions (110) and extending outwardly therefrom.

5. The socket (10) of claim 4 further having a retaining member (104) attached to and extending outwardly from said base section (92) and being intermediate said first and second spring arms (100, 102).

6. The socket (10) of claim 5 wherein a retaining bar (142) extends across respective said cavities (34) and respective said contact elements (16) are retained therein by said retaining member (104) and said second spring arm (102) frictionally bracketing said retaining bar (142).

* * * * *